United States Patent
Kim et al.

(10) Patent No.: US 10,997,882 B2
(45) Date of Patent: May 4, 2021

(54) SHORT DETECTION DEVICE, A SHORT DETECTION CIRCUIT AND A DISPLAY DEVICE USING THE SAME

(71) Applicant: SAMSUNG ELECTRONICS CO., LTD., Suwon-si (KR)

(72) Inventors: Jin Oh Kim, Suwon-si (KR); Sung Jin Lim, Suwon-si (KR); Chul Ho Choi, Seoul (KR); Ryan Wang, Taipei (TW); Dashih Chang, Taipei (TW); Ha Joon Shin, Hwaseong-si (KR); Hanss Su, Taipei (TW); Jin Soo Kim, Hwaseong-si (KR); Jin Woo Kim, Changwon-si (KR); Kyung Gyu Park, Suwon-si (KR); Sam Liu, Taipei (TW); Yao Sheng Liang, Taipei (TW)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 85 days.

(21) Appl. No.: 16/261,779

(22) Filed: Jan. 30, 2019

(65) Prior Publication Data
US 2020/0027379 A1  Jan. 23, 2020

(30) Foreign Application Priority Data

Jul. 23, 2018 (KR) .................. 10-2018-0085204
Aug. 24, 2018 (KR) .................. 10-2018-0099023

(51) Int. Cl.
*G09G 3/00* (2006.01)
*G01R 1/30* (2006.01)
(Continued)

(52) U.S. Cl.
CPC .............. *G09G 3/006* (2013.01); *G01R 1/30* (2013.01); *G01R 31/2825* (2013.01);
(Continued)

(58) Field of Classification Search
CPC .............. G09G 3/006; G09G 2330/12; G09G 2310/0275; G09G 2310/0291; G09G 2320/045; G09G 2320/0693; G09G 2320/0233; G09G 3/20; G09G 2310/0267; G09G 3/00; G01R 31/50; G01R 1/30; G01R 31/2825
See application file for complete search history.

(56) References Cited

U.S. PATENT DOCUMENTS 6,275,061 B1   8/2001   Tomita
7,824,930 B2   11/2010  Koshiishi et al.
(Continued)

FOREIGN PATENT DOCUMENTS

KR   10-0507269   11/2005
KR   10-0911313   8/2009
(Continued)

*Primary Examiner* — Akm Zakaria
(74) *Attorney, Agent, or Firm* — F. Chau & Associates, LLC

(57) ABSTRACT

A display device including: a panel unit including N data lines; and a data line driver unit including N channels, wherein the data line driver unit includes a channel amplifier unit, and a short detection device for detecting whether or not a short has occurred between two data lines among the N data lines, wherein N is an integer of 2 or more.

17 Claims, 10 Drawing Sheets

(51) Int. Cl.
    *G01R 31/28*     (2006.01)
    *G01R 31/50*     (2020.01)

(52) U.S. Cl.
    CPC ..... *G01R 31/50* (2020.01); *G09G 2310/0275* (2013.01); *G09G 2310/0291* (2013.01); *G09G 2330/12* (2013.01)

(56) References Cited

U.S. PATENT DOCUMENTS

| | | |
|---|---|---|
| 8,310,262 B2 | 11/2012 | Lee et al. |
| 9,262,952 B2 | 2/2016 | Kim et al. |
| 9,583,033 B2 | 2/2017 | Yun et al. |
| 2005/0168491 A1* | 8/2005 | Takahara ............. G09G 3/3241 345/690 |
| 2007/0216618 A1 | 9/2007 | Kim et al. |
| 2007/0236244 A1* | 10/2007 | Ando ................... G09G 3/3688 324/760.01 |
| 2016/0300534 A1* | 10/2016 | Kishi ................... G09G 3/3283 |
| 2016/0379548 A1 | 12/2016 | Shin et al. |
| 2017/0249894 A1* | 8/2017 | Tsuchi ........... H03K 19/017509 |
| 2017/0269398 A1 | 9/2017 | Park |
| 2018/0307340 A1* | 10/2018 | Gotoh .................. G06F 3/0412 |

FOREIGN PATENT DOCUMENTS

| | | |
|---|---|---|
| KR | 10-1427329 | 8/2014 |
| KR | 10-2017-0061779 | 6/2017 |

\* cited by examiner

PRIOR ART

| Display Mode | Panel Short Defect Detection Period | Display Mode |
|---|---|---|
| Channel AMP (i.e., AMP_1~AMP966) ON | OFF | ON |
| Detection AMP (i.e., AMP_H/_L) OFF | ON | OFF |

FIG. 4B

| Inversion type | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| H1DOT | − | + | − | + | − | + | − | + | − | + | − | + | − | + | − | + |
| H1+2DOT | − | + | + | − | − | + | + | − | − | + | + | − | − | + | + | − |
| 6H1DOT | − | + | − | + | − | + | + | − | + | − | + | − | − | + | − | + |
| 4H1RDOT | − | + | + | − | + | − | − | + | − | + | + | − | + | − | − | + |
| 4H1DOT | − | + | − | + | + | − | + | − | − | + | − | + | + | − | + | − |

FIG. 5

SHORT DETECTION DEVICE, A SHORT DETECTION CIRCUIT AND A DISPLAY DEVICE USING THE SAME

CROSS-REFERENCE TO RELATED APPLICATIONS

This application claims priority under 35 U.S.C. § 119 to Korean Patent Application No. 10-2018-0085204 filed on Jul. 23, 2018 in the Korean Intellectual Property Office (KIPO), and Korean Patent Application No. 10-2018-0099023 filed on Aug. 24, 2018 in the KIPO, the disclosures of which are incorporated by reference herein in their entireties.

TECHNICAL FIELD

The present inventive concept relates to a short detection device of a display panel, and more particularly, to a short detection device for a display driver chip application, a short detection circuit and a display device using the same.

DESCRIPTION OF RELATED ART

As the resolution of a display increases, the amount of scan lines and data lines included in the display increases. For example, in a display panel having 4K resolution, the number of scan lines and data lines are 2,160 and 3,840, respectively. Since there are a considerable number of metal lines passing through such a panel and a space between the metal lines is significantly narrow, there is a high possibility that a short may occur when establishing a connection between the metal lines.

Such a metal short connection may lead to current leakage, and furthermore, display quality abnormality. Taking two data lines having different gradation voltages as an example, a short between the lines causes current leakage, which breaks a voltage level of a source line in a stable state. The voltage level of the source line may eventually deviate from an expected gradation voltage level to affect a final quality of a display panel. To prevent an abnormal display caused by short defects in the panel, in an optical measurement method, e.g., a method of detecting an abnormal short connection on the panel, may be used. In an optical detection method in the related art, defects with respect to a short connection on the panel are detected by sensing a change in brightness.

FIG. 1 is a schematic diagram of a short connection on a display panel, leakage of current, and an optical measurement method in the related art. FIG. 1 illustrates a situation in which a short connection is present between directly adjacent lines in a panel having 966 data lines. For example, FIG. 1 illustrates a short connection between adjacent data lines S2 and S3. In the optical measurement method, the data lines S2 and S3 are driven by different operational amplifiers with different gradation voltages. An abnormal short connection between the data lines S2 and S3 makes a flow of current passing through the data lines S2 and S3 abnormal, thereby affecting voltage levels of the data lines S2 and S3 and causing the voltage levels to deviate from a preset voltage level. The deviation of the voltage levels of the data lines S2 and S3 affects a storage voltage of a pixel, and leads to irregular brightness. The optical measurement detects the short connection of the display panel by sensing this irregular brightness.

Even though the optical measurement method is accurate, additional equipment and measurement procedures are required. In addition, the optical measurement method can provide a detection function during a display panel testing stage, but cannot detect display panel defects during a normal operating period of a display panel. Therefore, the optical measurement method does not provide continuous detection.

SUMMARY

A display device according to exemplary embodiments of the present inventive concept includes: a panel unit including N data lines; and a data line driver unit including N channels, wherein the data line driver unit includes a channel amplifier unit, and a short detection device for detecting whether or not a short has occurred between two data lines among the N data lines, wherein N is an integer of 2 or more.

A short detection device according to exemplary embodiments of the present inventive concept may include a first short detection amplifier and a second short detection amplifier respectively connected to at least one or more data lines among N data lines included in a display panel; and a detection unit connected to an output terminal of the first short detection amplifier or an output terminal of the second short detection amplifier to detect a leakage current generated when a short has occurred between two data lines among the N data lines, wherein N is an integer of 2 or more.

A short detection circuit according to exemplary embodiments of the present inventive concept may include a current mirror unit for a first output transistor and a second output transistor included in a short detection amplifier, wherein a short detection circuit is connected to an output terminal of the short detection amplifier that is connected to at least one or more data lines among N data lines included in a display panel, wherein the short detection circuit detects a leakage current generated when a short has occurred between at least two lines among the N data lines, wherein N is an integer of 2 or more.

A display device according to an exemplary embodiment of the present inventive concept may include: a display panel including a plurality of data lines; and a data line driver including: a plurality of amplifiers connected to the data lines; a first switch group connected to the data lines; a second switch group connected to the data lines; a first short detection amplifier connected to the first switch group; a second short detection amplifier connected to the second switch group; and a detection unit connected to an output terminal of each of the first and second short detection amplifiers.

BRIEF DESCRIPTION OF THE DRAWINGS

The above and other features of the present inventive concept will be more clearly understood by describing in detail exemplary embodiments thereof with reference to the accompanying drawings, in which:

FIG. 4B is a time chart for a short detection function, according to an exemplary embodiment of the present inventive concept;

FIG. 5 is a data polarity list of 16 source lines corresponding to different inversion patterns according to an exemplary embodiment of the present inventive concept;

DETAILED DESCRIPTION OF THE EMBODIMENTS

Figure 1:
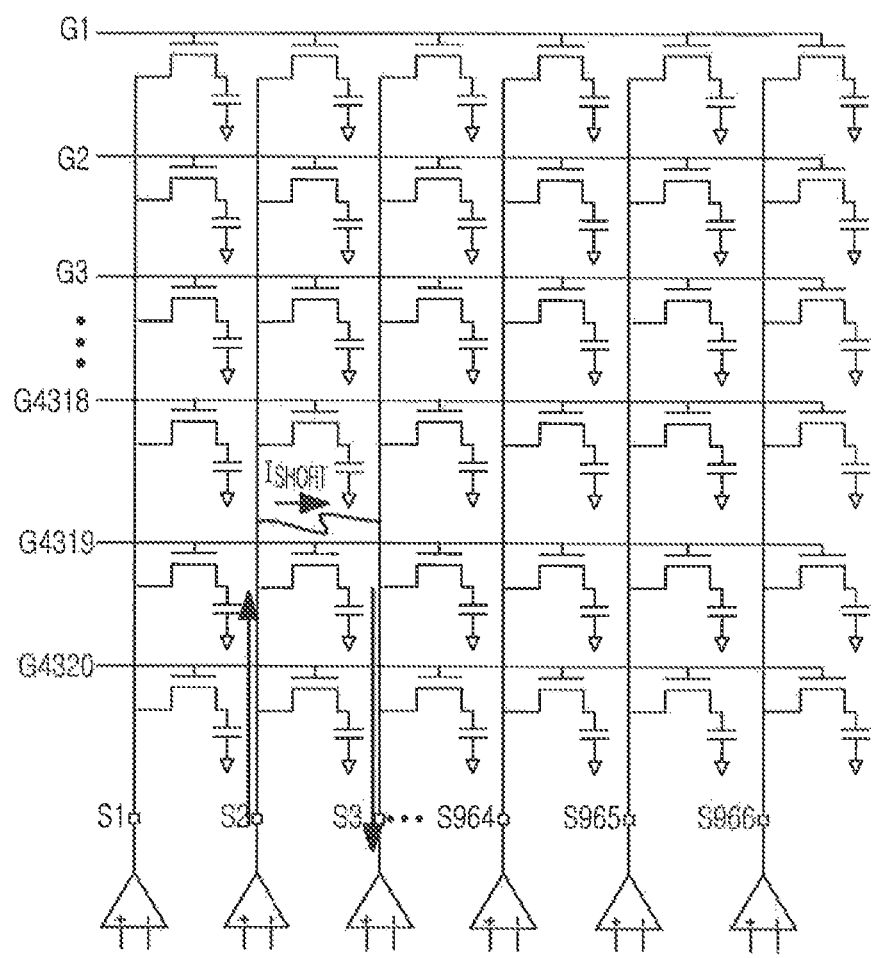
FIG. 1 is a schematic diagram of a short connection on a display panel, leakage of current, and an optical measurement method in the related art.

Hereinafter, exemplary embodiments of the present inventive concept will be described with reference to the accompanying drawings.

The present inventive concept may, however, be embodied in many different forms and should not be construed as limited to the exemplary embodiments set forth herein. Throughout the specification, the same reference numerals may refer to the same elements.

In this disclosure, the term "unit", "module", "table", or the like may refer to hardware components such as software, a field programmable gate array (FPGA), or an application specific integrated circuit (ASIC). For example, a module may perform certain functions. However, the module is not limited to software or hardware. The module may be configured to reside on an addressable storage medium or may be configured to use one or more processors. Therefore, as an example, the module includes components such as software components, object-oriented software components, class components, and task components, processes, functions, attributes, procedures, subroutines, segments of program codes, drivers, firmware, microcode, circuit, data, database, data structures, tables, arrays, and variables. Functions provided in the components and modules may be coupled to a smaller number of components and modules or further separated into additional components and modules. In addition, components and modules may be implemented to use one or more central processing units (CPUs) in a particular device.

Exemplary embodiments of the present inventive concept provide a display driver integrated circuit (DDI) built-in panel defect detection device capable of continuously detecting defects of a display panel without having to use additional optical equipment and measurement procedures.

Figure 2:
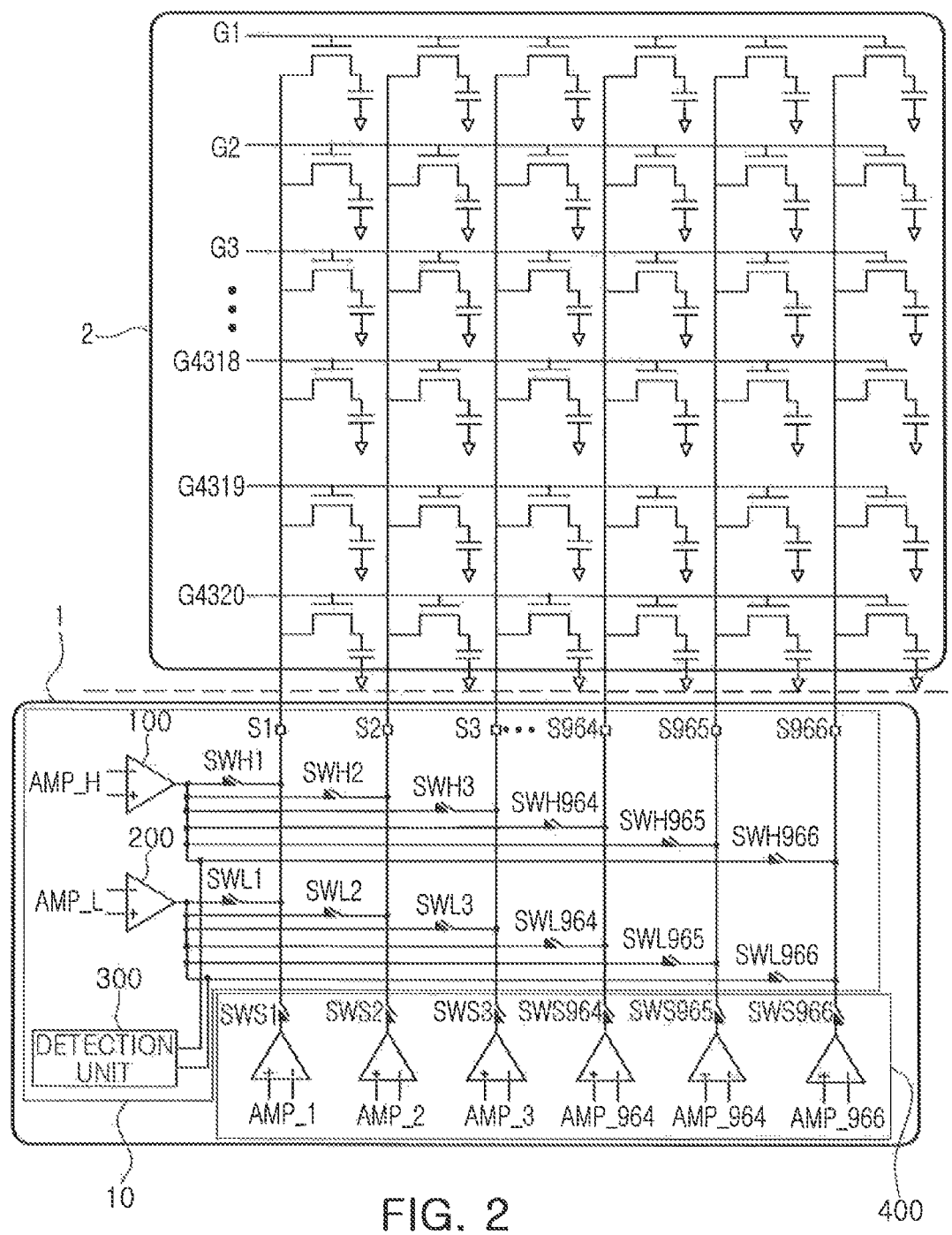
FIG. 2 is a schematic diagram of a short detection device of a display panel according to an exemplary embodiment of the present inventive concept.

FIG. 2 illustrates a short detection device of a display panel according to an exemplary embodiment of the present inventive concept. FIG. 2 illustrates a data line driver 1 and a display panel 2. The data line driver 1 may also be referred to as a source IC (SIC). The data driver 1 may include a short detection device 10 and a plurality of amplifiers 400. The data driver 1 may include 966 channels. The plurality of amplifiers 400 may include a plurality of channel amplifiers AMP_1 to AMP_966 corresponding to the 966 channels, and output switches SWS1 to SWS966. The short detection device 10 may include a first short detection amplifier 100 or AMP_H and a second short detection amplifier 200 or AMP_L, first switch groups SWH1 to SWH966 and second switch groups SWL1 to SWL966, and a detection unit 300.

The display panel 2 may include a plurality of gate lines G1 to G4320 and a plurality of data lines S1 to S966. Pixels are connected at intersections of the gate lines G1 to G4320 and the data lines S1 to S966. As shown in FIG. 2, each of the pixel circuits may include at least one of a transistor and a capacitor.

Although FIG. 2 illustrates 966 channels, this is merely exemplary. For example, the data driver 1 may have more or less than 966 channels, and thus, depending on changes in the number of channels, the number of the channel amplifiers AMP_1 to AMP_966 and the number of the output switches SWS1 to SWS966 may be changed. In addition, the number of the first and second switch groups SWH1 to SWH966 and SWL1 to SWL966 may be equal to or less than the number of channels, and the first and second switch groups SWH1 to SWH966 and SWL1 to SWL966 illustrated in FIG. 2 are continuously connected to the respective data lines S1 to S966. It is to be understood, however, the first and second switch groups SWH1 to SWH966 and SWL1 to SWL966 may not be continuously connected to the respective data lines S1 to S966. In addition, as illustrated in FIG. 2, the first short detection amplifier 100 and the second short detection amplifier 200 are connected to all of the data lines S1 to S966, but this is merely exemplary. It is to be understood, however, that the first short detection amplifier 100 and the second short detection amplifier 200 may only be connected to some of the data lines S1 to S966. In this case, a short between those data lines to which the first and second short detection amplifiers 100 and 200 are connected may be detected.

Additionally, FIG. 2 illustrates that the first switch groups SWH1 to SWH966 and the second switch groups SWL1 to SWL966 are all connected to a path on which the first short detection amplifier 100 and the second short detection amplifier 200 are connected to the data lines S1 to S966. It is to be understood, however, that the number of switches belonging to the first switch groups SWH1 to SWH966 and the second switch groups SWL1 to SWL966 may vary depending on whether or not a particular one of the data lines S1 to S966 is connected to the first and second short detection amplifiers 100 and 200.

In FIGS. 2 to 4B, and 8, for convenience of explanation, a description will be given using an exemplary embodiment of the present inventive concept in which the first short detection amplifier 100 and the second short detection amplifier 200 are connected to all of the data lines S1 to S966, and the first switch groups SWH1 to SWH966 and the second switch groups SWL1 to SWL966 are connected to all of the connection paths.

Figure 3:
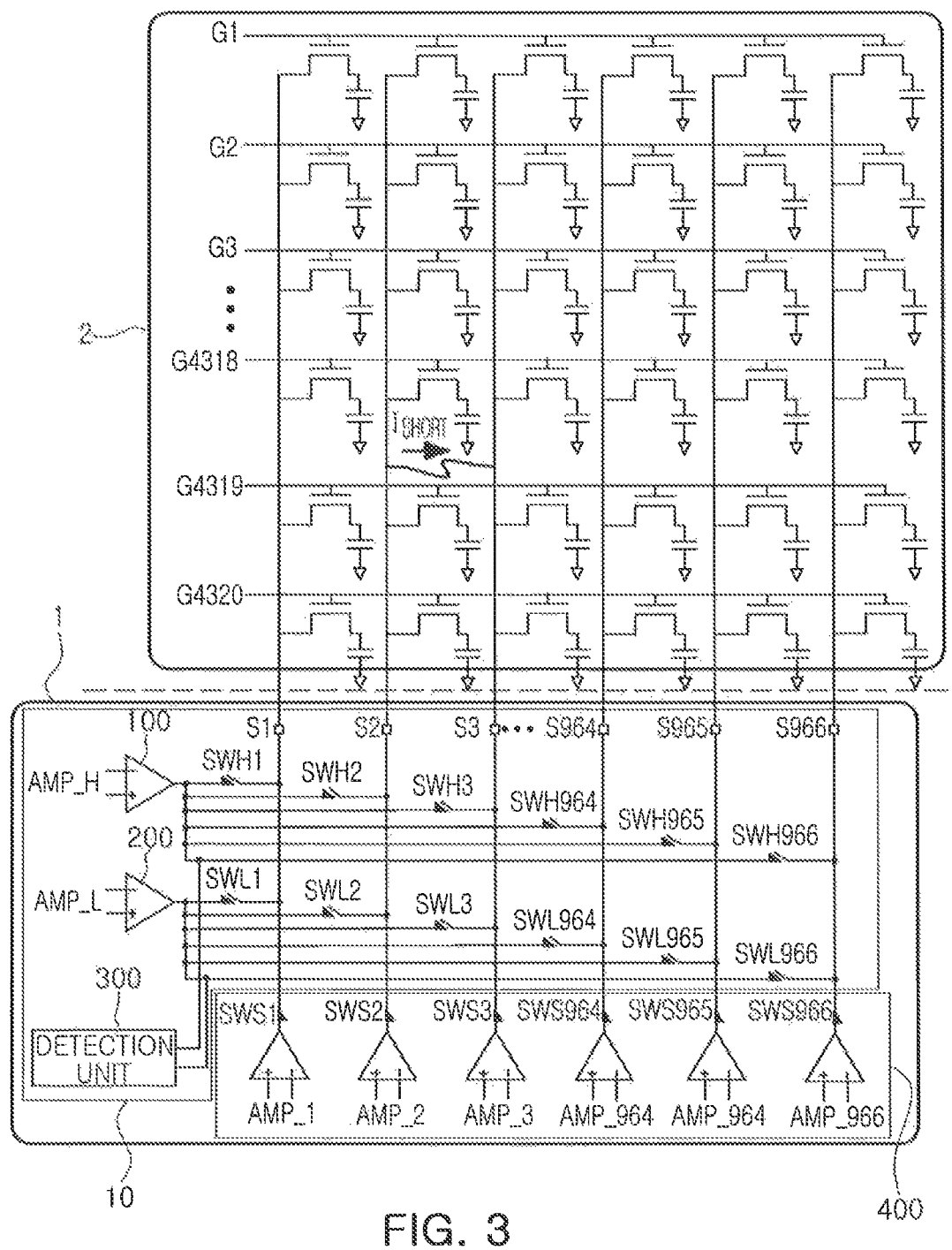
FIG. 3 is a schematic diagram of a display panel in the case of performing a normal operation while having an abnormal short defect connection between adjacent data lines, according to an exemplary embodiment of the present inventive concept.

FIG. 3 illustrates a display panel in the case of performing a normal operation while having an abnormal short defect connection $I_{SHORT}$ between adjacent data lines, according to an exemplary embodiment of the present inventive concept. In FIG. 3, the output switches SWS1 to SWS966 are turned on, and 966 data lines S1 to S966 on the display panel 2 are driven by the corresponding channel amplifiers AMP_1 to AMP_966. When a short connection has occurred between the data lines S2 and S3, a leakage current flowing through the channel amplifiers AMP_2 and AMP_3 having different gradation voltage levels may exist. However, when the leakage current has the same gradation voltage, a certain leakage current will not be detected. When, however, the leakage current resulting from the short connection is greater than a driving acceptance range of one of the channel amplifiers AMP_2 and AMP_3, the voltage level across the data lines S2 and S3 will be outside of the expected range, and thus, the display will be abnormal.

Figure 4A:
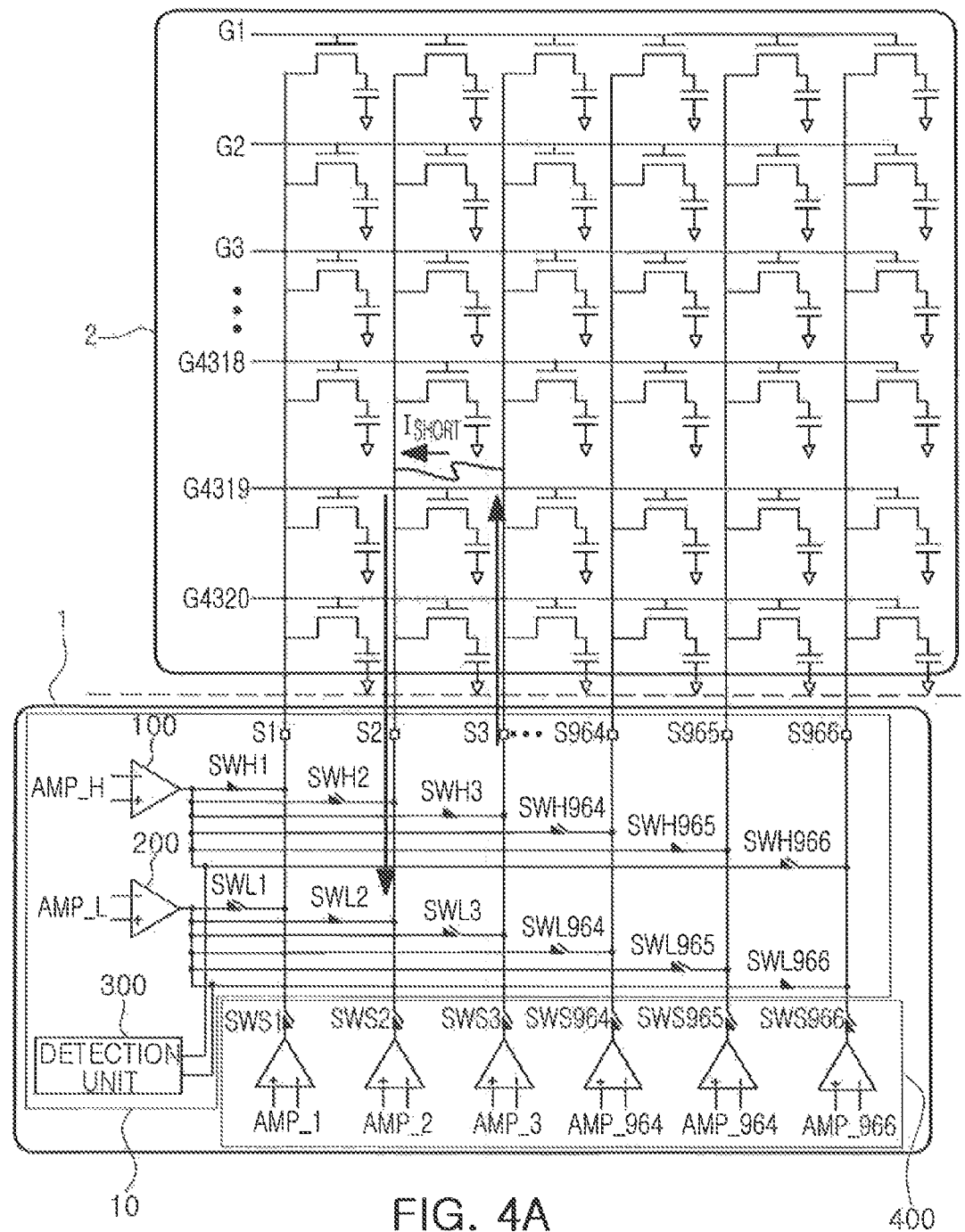
FIG. 4A is a schematic diagram of a short detection device of a display panel in which a panel defect detection function is activated according to an exemplary embodiment of the present inventive concept.

FIG. 4A illustrates a short detection device of a display panel in which a panel defect detection function is activated according to an exemplary embodiment of the present inventive concept. During a normal panel operating period such as a display porch period, a black display period, a power block period, and the like, all of the data lines S1 to S966 are driven by the first short detection amplifier 100 and the second short detection amplifier 200 instead of the channel amplifiers AMP_1 to AMP_966. The first short detection amplifier 100 and the second short detection amplifier 200 have different gradation voltage levels.

In an exemplary embodiment of the present inventive concept, among the 966 data lines S1 to S966, odd-numbered and even-numbered data lines are driven by the first short detection amplifier 100 and the second short detection amplifier 200, respectively. When the short connection $I_{SHORT}$ has occurred between adjacent data lines S2 and S3, the corresponding leakage current flows through the first short detection amplifier 100 and the second short detection amplifier 200. The detection unit 300 senses the leakage current and the voltage changes at the data lines S2 and S3 to detect the short connection.

To accomplish this, whether or not each of the switches belonging to the first switch groups SWH1 to SWH966 and the second switch groups SWL1 to SWL966 is opened or closed is determined. For the short detection between directly adjacent data lines, as illustrated in FIG. 4A, in one group of the first switch groups SWH1 to SWH966 and the second switch groups SWL1 to SWL966, the even-numbered switches are opened and the odd-numbered switches are closed, while in other group, the odd-numbered switch groups are opened and the even-numbered switches are closed.

FIG. 4B is a time chart illustrating a short detection function, according to an exemplary embodiment of the preset inventive concept. For example, the data lines S1 to S966 are driven by the channel amplifiers AMP_1 to AMP_966 and the first short detection amplifier 100 and the second short detection amplifier 200 during a display mode period and a panel short defect detection period, respectively. As illustrated in FIG. 4B, in the display mode, the channel amplifiers AMP_1 to AMP_966 are in an ON state and the first and second short detection amplifiers 100 and 200 are in an OFF state. In the panel short defect detection period, whether or not a short between the data lines S1 to S966 has occurred may be detected by switching the channel amplifiers AMP_1 to AMP_966 to the OFF state and the first and second short detection amplifiers 100 and 200 to the ON state.

FIGS. 3 to 4B relate to an exemplary embodiment of the present inventive concept in which a short connection occurring between directly adjacent data lines can be determined. However, a short connection may occur between data lines which are not adjacent to each other, such as when a short has occurred between data lines S1 and S3, or when a short has occurred between data lines S1 and S4. To handle such a case, another exemplary embodiment of the present inventive concept may be used. For example, that embodiment detects short defects by changing a data pattern polarity.

To detect short defects between non-adjacent lines, several preset data line polarity inversion patterns, such as H1DOT, H1+2DOT, 6H1DOT, 4H1RDOT, 4H1DOT, and the like may be employed.

FIG. 5 illustrates data polarity lists of 16 data lines corresponding to different inversion patterns according to an exemplary embodiment of the present inventive concept. In FIG. 5, the data polarity of the data lines after S16 is repeated every 16 lines. By applying such different inversion patterns, different panel short defects may be detected. For example, in the case of applying the H1DOT pattern, short defects between directly adjacent data lines may be identified. To detect short defects occurring between two data lines that are not directly adjacent to each other (for example, S1 and S3), the H1+2DOT data inversion pattern is applied. The 4H1RDOT and 4H1DOT data inversion patterns can be used to detect short defects occurring between two data lines having three different data lines disposed therebetween. The 6H1DOT data inversion pattern can be used to detect short defects occurring between two data lines having five different data lines disposed therebetween.

According to an exemplary embodiment of the present inventive concept, the data polarity having such different inversion patterns is implemented by the first and second short detection amplifiers 100 and 200 and the first and second switch groups SWH1 to SWH966 and SWL1 to SWL966.

Figure 6:
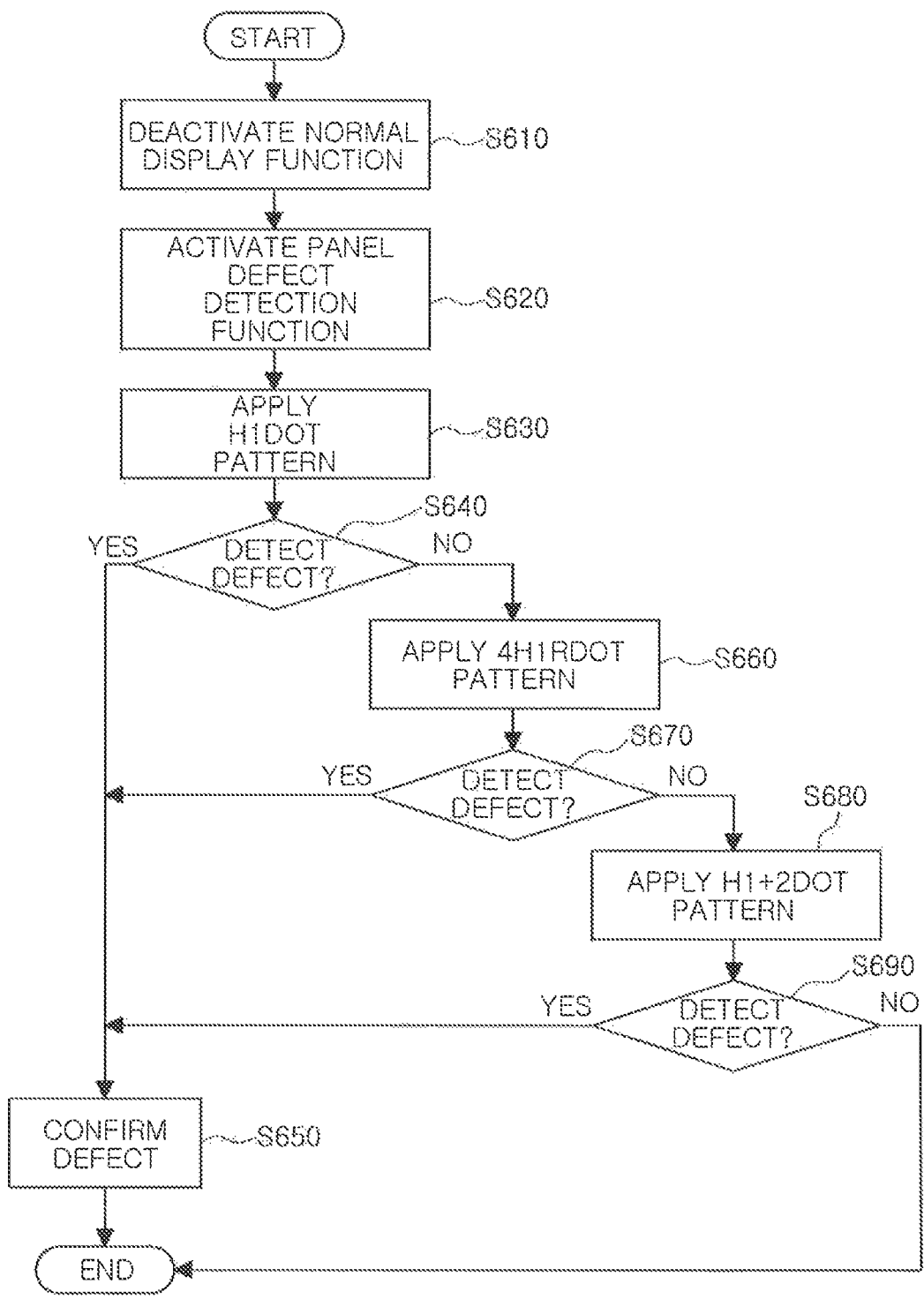
FIG. 6 is a flow chart of an operating method of a short detection device of a display panel according to an exemplary embodiment of the present inventive concept.

FIG. 6 is a flow chart illustrating an operating method of a short detection device of a display panel according to an exemplary embodiment of the present inventive concept. After switching the display mode to the panel short detection mode (S610 to S620), whether or not a short defect has occurred between directly adjacent data lines (S630 and S640), whether or not a short defect has occurred between two data lines having one other data line disposed therebetween (S660 and S670), and whether or not a short defect has occurred between two data lines having three different data lines disposed therebetween may be detected. Although FIG. 6 illustrates an example in which three inversion patterns H1DOT, 4H1RDOT and H1+2DOT are applied, the present inventive concept is not limited thereto. For example, the number of inversion patterns and the order of their application can be varied. For example, at least one or more patterns among the inversion patterns illustrated in FIG. 5 may be applied. It is to be understood that for the short defect detection in a situation in which there are one or more data lines between the two data lines which are objects for defect detection, the different inversion patterns used may be sequentially applied, as illustrated in FIG. 6.

Still referring to FIG. 6, in (S610), the normal display function is deactivated and, in (S620), the panel defect function is activated. In (S630), the H1DOT pattern is applied and, in (S640), it is determined whether a defect has been detected. If no defect is detected, in (S660), the 4H1RDOT pattern is applied and, in (S670), it is again determined whether a defect has been detected. If no defect is detected, in (S680), the H1+2DOT pattern is applied and, in (S690), it is again determined whether a defect has been detected. In the case that a defect is detected in (S640, S670, S690), the defect is confirmed in (S650).

For DDI applications, a configuration of an amplifier may adopt a class-AB format, since liquid crystal display (LCD) pixels are displayed with a high slew rate requirement for the inverted polarity and picture data due to the high display resolution.

Figure 7:
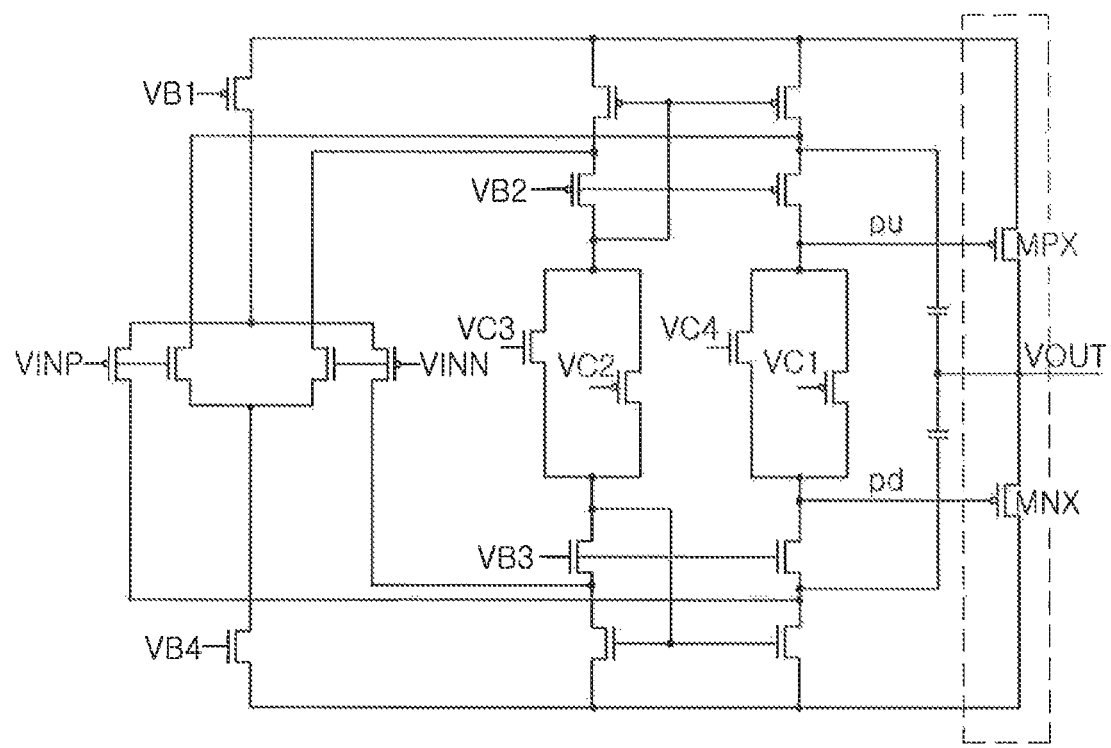
FIG. 7 is a circuit diagram of a data amplifier according to an exemplary embodiment of the present inventive concept.

FIG. 7 illustrates a data amplifier according to an exemplary embodiment of the present inventive concept. In FIG. 7, pu and pd are gate control voltages of output terminals of transistors MPX and MNX, respectively, VINP and VINN are input voltages, VOUT is an output voltage, and VB1, VB2, VB3, VB4 and VC1, VC2, VC3 and VC4 are bias voltages. In addition, FIG. 8 illustrates a relationship between the panel and the circuitry of the short current detection unit during the defect detection period according to an exemplary embodiment of the present inventive concept.

Figure 8:
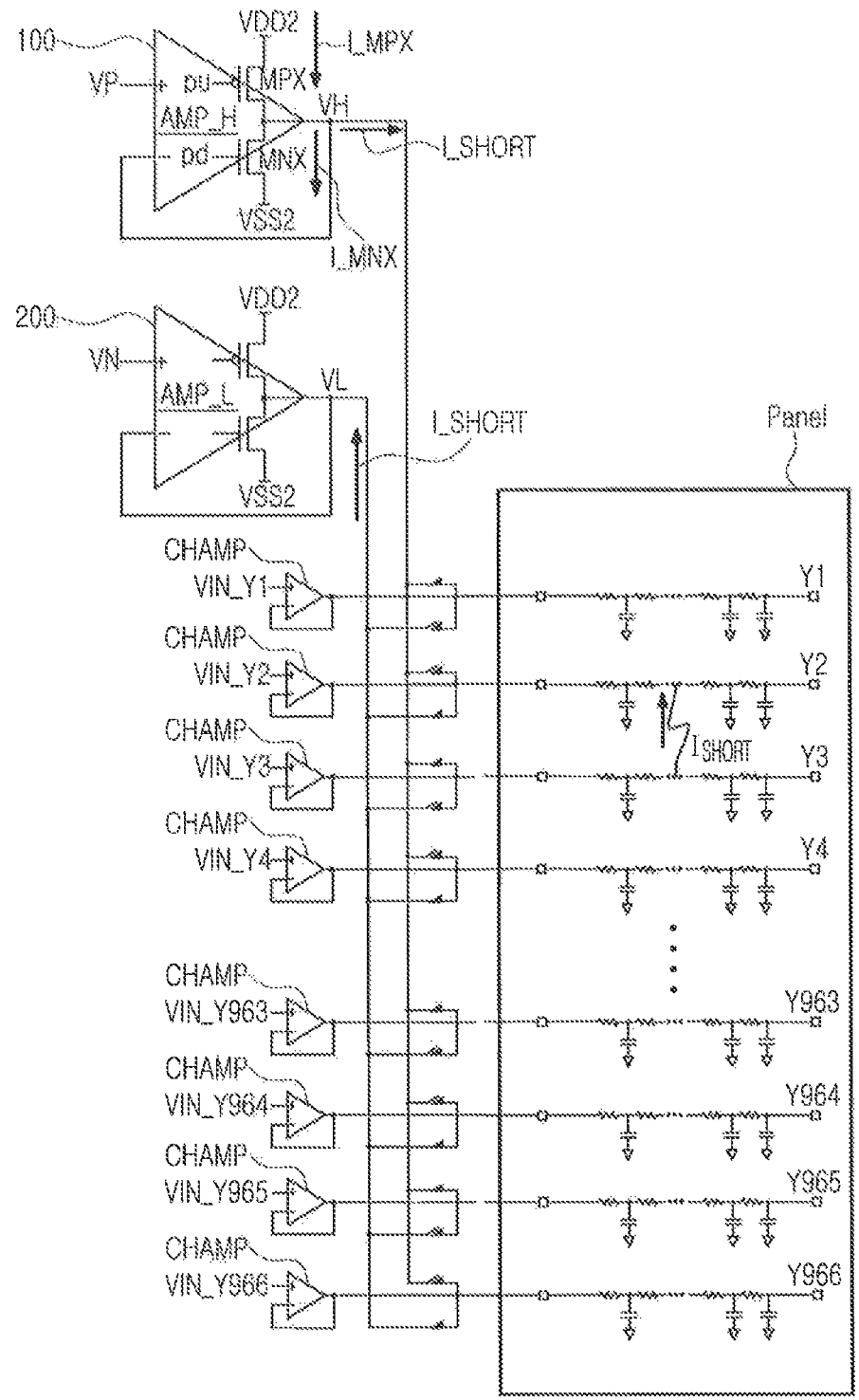
FIG. 8 is a schematic diagram illustrating a relationship between a panel and a circuit of a short current detection unit during a defect detection period according to an exemplary embodiment of the present inventive concept.

As illustrated in FIG. 8, the first short detection amplifier 100 AMP_H, the second short detection amplifier 200 AMP_L, and 966 data amplifiers CHAMP are provided. In addition, short defects, a panel parasitic voltage and a panel parasitic capacitor are present. During the detection period, it is assumed that there is a short leakage current that flows between a data line Y2 and data line Y3. In this case, a short leakage current I_SHORT flows from/to the first short detection amplifier 100 and the second short detection amplifier 200. At this time, the short leakage current I_SHORT is expressed as [Equation 1] below.

$$I\_SHORT = I\_MPX - I\_MNX \quad \text{[Equation 1]}$$

In equation 1, MPX and MNX refer to output terminals of the first short detection amplifier 100. When the short connection is not detected on the panel, I_MPX and I_MNX are the same as the quiescent current of the first short detection amplifier 100, such that I_SHORT is zero amperes. When the short detection defect exists, as expressed in [Equation 1], the first short detection amplifier 100 supplies short currents.

As further shown in FIG. 8, the data amplifiers CHAMP are respectively input with voltages VIN_Y1 to VIN-Y966, 966 data lines Y1 to Y966 are provided on the panel, the first short detection amplifier 100 is provided with VP at its input, transistor MPX is provided with a voltage VDD2, transistor MNX is provided with a voltage VSS2, and the second short detection amplifier 200 is provided with VN at its input. The first short detection amplifier 100 outputs VH, and the second short detection amplifier 200 outputs VL.

Figure 9A:
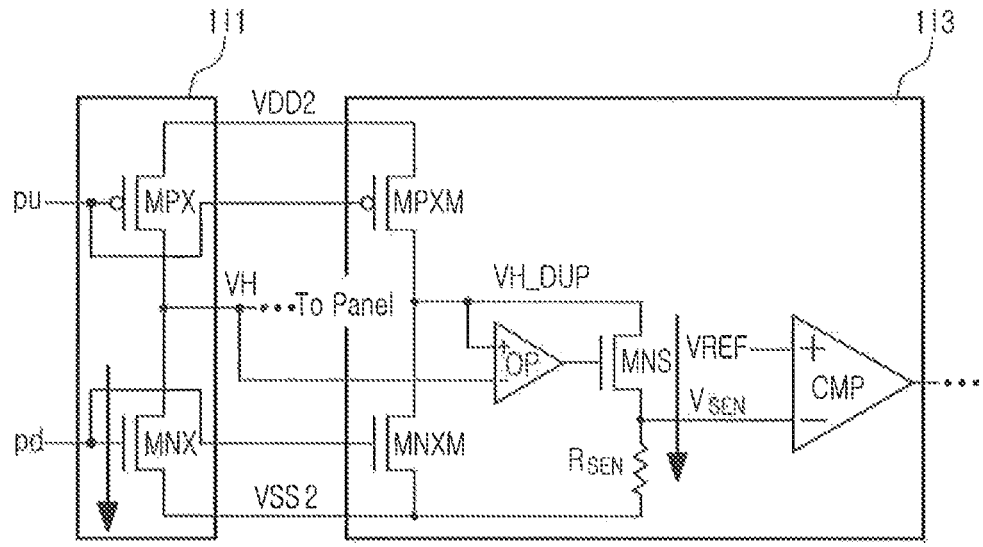
FIGS. 9A and 9B are circuit diagrams of a leakage current detection circuit according to an exemplary embodiment of the present inventive concept.
Figure 9B:
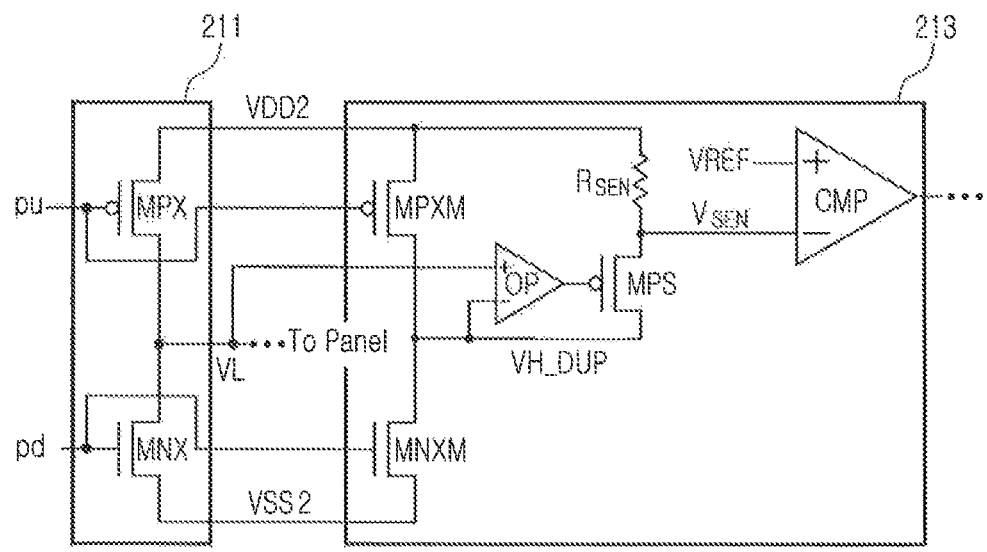

FIGS. 9A and 9B illustrate a current subtraction circuit, in other words, a leakage current detection circuit, according to an exemplary embodiment of the present inventive concept. Leakage current detection circuits 113 and 213 according to an exemplary embodiment of the present inventive concept are for precisely detecting the leakage current as described above. In FIGS. 9A and 9B, transistors MPX/MNX are the output terminals 111 and 211 of the first and second short detection amplifiers 100 and 200. The leakage current detection circuits 113 and 213 according to an exemplary embodiment of the present inventive concept may include components for detecting such as transistors MPXM/MNXM, MNS/MPS, an operational amplifier OP, a resistor Rsen, a comparator CMP, and the like. FIGS. 9A and 9B illustrate two mutually complementary types of current subtraction circuits. The leakage current detection circuits 113 and 213 correspond to the detection unit 300 in FIGS. 2 to 4A.

In FIG. 9A, MPXM and MNXM are current mirror units of MNX, and a mirror ratio is selectively determined according to respectively different applications. To ensure an accurate ratio of the subtracted current I_MNS and the mirrored current, the operational amplifier OP is added to fix drain voltages of MPX/MNX and MPXM/MNXM (in other words, VH=VH_DUP). Some of the short leakage current expressed by [Equation 1] and supplied by the first short detection amplifier 100 flows to the transistor MNS and the resistor Rsen according to the mirror ratio. By using the resistor Rsen, the leakage current may be converted to a voltage value and may be compared with the reference voltage VREF for detection. As an example, when the mirror ratio is set to 1, the current flowing through the transistor MNS and the resistor Rsen is expressed by the following [Equation 2].

$$I\_MNS = I\_Rsen = I\_MPXM - I\_MNXM = I\_MPX - IMNX = I\_SHORT$$

Here, when a converted voltage Vsen is greater than a reference voltage VREF, a comparator CMP outputs a high value, which means that a short defect has been detected.

When detection is performed by the second short detection amplifier 200 instead of the first short detection amplifier 100, a circuit as illustrated in FIG. 9B is used.

As set forth above, by employing a short detection device, a short detection circuit and a display device of the display panel according to an exemplary embodiment of the present inventive concept, a display driver IC or DDI may continuously and accurately detect a panel short defect without having to use optical equipment.

While the present inventive concept has been shown and described with reference to exemplary embodiments thereof, it will be apparent to those skilled in the art that modifications and variations could be made thereto without departing from the scope of the present inventive concept as defined by the appended claims.

What is claimed is:

1. A display device, comprising:
a panel unit including N data lines; and
a data line driver unit including N channels,
wherein the data line driver unit includes a channel amplifier unit including a plurality of channel amplifiers, and a short detection device for detecting whether or not a short has occurred between two data lines among the N data lines,
wherein N is an integer of 2 or more,
wherein the short detection device comprises a first short detection amplifier and a second short detection amplifier, and
wherein an output terminal of the first short detection amplifier and an output terminal of the second short detection amplifier are connected to M consecutive data lines among the N data lines,
the short detection device comprising:
M first switch groups in which a first end is connected to the output terminal of the first short detection amplifier and a second end is connected to the M data lines; and
M second switch groups in which a first end is connected to the output terminal of the second short detection amplifier and a second end is connected to the M data lines,
wherein M is an integer greater than or equal to 2 and less than or equal to N.

2. The display device of claim 1, wherein the short detection device further comprises a detection unit connected to the output terminal of the first short detection amplifier or the output terminal of the second short detection amplifier to detect a leakage current generated when a short has occurred between the two data lines among the N data lines.

3. The display device of claim 1, wherein gradation voltage values of the first short detection amplifier and the second short detection amplifier are different from each other.

4. The display device of claim 1, wherein the output terminal of the first short detection amplifier is connected to an odd-numbered data line among the N data lines and the output terminal of the second short detection amplifier is connected to an even-numbered data line among the N data lines, to detect whether or not the short has occurred between the odd-numbered data line and the even-numbered data line.

5. The display device of claim 1, wherein the short detection device opens a first portion of switches of the M first switch groups, and closes a second portion of switches of the M second switch groups, according to a preset rule.

6. The display device of claim 5, wherein the preset rule includes two or more preset rules, and the short detection device detects whether or not the short has occurred by sequentially applying the two or more of the preset rules.

7. The display device of claim 2, wherein the first short detection amplifier or the second short detection amplifier comprises a first output transistor and a second output transistor, and
a leakage current value of current flow caused by the short between the two data lines among the N data lines is a difference between a current value flowing in the first output transistor and a current value flowing in the second output transistor.

8. The display device of claim 7, wherein the detection unit comprises a current mirror unit for the first output transistor or the second output transistor, and the detection unit detects whether or not the short between the two data lines among the N data lines has occurred by using at least a portion of a mirrored current flowing in the current mirror unit.

9. A short detection device, comprising:
a first short detection amplifier and a second short detection amplifier respectively connected to at least one or more data lines among N data lines included in a display panel; and
a detection unit connected to an output terminal of the first short detection amplifier or an output terminal of the second short detection amplifier to detect a leakage current generated when a short has occurred between two data lines among the N data lines,
wherein N is an integer of 2 or more,
wherein the output terminal of the first short detection amplifier and the output terminal of the second short detection amplifier are connected to M consecutive data lines among the N data lines,
the short detection device comprising:
M first switch groups in which a first end is connected to the output terminal of the first short detection amplifier and a second end is connected to the M data lines; and
M second switch groups in which a first end is connected to the output terminal of the second short detection amplifier and a second end is connected to the M data lines, respectively,
wherein M is an integer greater than or equal to 2 and less than or equal to N.

10. The short detection device of claim 9, wherein gradation voltage values of the first short detection amplifier and the second short detection amplifier are different from each other.

11. The short detection device of claim 9, wherein the output terminal of the first short detection amplifier is connected to an odd-numbered data line among the N data lines and the output terminal of the second short detection amplifier is connected to an even-numbered data line among the N data lines, to detect whether or not a short between the odd-numbered line and the even-numbered line has occurred.

12. The short detection device of claim 9, wherein the short detection device opens first switches of the M first switch groups, and closes second switches, of the M second switch groups, according to a preset rule.

13. The short detection device of claim 12, wherein the preset rule includes two or more preset rules, and the short detection device detects whether or not the short has occurred by sequentially applying the two or more of the preset rules.

14. The short detection device of claim 9, wherein the first short detection amplifier or the second short detection amplifier comprises a first output transistor and a second output transistor, and
a leakage current value of current flow caused by the short between the two lines among the N data lines is a difference between a current value flowing in the first output transistor and a current value flowing in the second output transistor.

15. The short detection device of claim 14, wherein the detection unit comprises a current mirror unit for the first output transistor or the second output transistor, and the detection unit detects whether or not the short between the two data lines among the N data lines has occurred by using at least some of a mirrored current flowing in the current mirror unit.

16. A short detection circuit, comprising:
a current mirror unit for at first output transistor and a second output transistor included in a first short detection amplifier,
wherein the short detection circuit is connected to an output terminal of the first short detection amplifier that is connected to M consecutive data lines among N data lines included in a display panel and to an output terminal of a second short detection amplifier that is connected to the M consecutive data lines among the N data lines,
wherein the short detection circuit detects a leakage current generated when a short has occurred between at least two lines among the N data lines, wherein N is an integer of 2 or more,
the short detection circuit comprising:
M first switch groups in which a first end is connected to the output terminal the first short detection amplifier and a second end is connected to the M data lines; and
M second switch groups in which a first end is connected to the output terminal of the second Short detection amplifier and a second egad is connected to the M data lines,
wherein M is an integer greater than or equal to 2 and less than or equal to N.

17. The short detection circuit of claim 16, wherein the current mirror unit comprises a first current mirror transistor unit and a second current mirror transistor unit having the same drain voltage as a drain voltage of the first output transistor and the second output transistor.

* * * * *